(12) United States Patent
Li et al.

(10) Patent No.: US 8,169,249 B2
(45) Date of Patent: *May 1, 2012

(54) CALIBRATING A SYSTEM BY SETTING DIFFERENCE BETWEEN SIGNALS

(75) Inventors: Guoxing Li, Sunnyvale, CA (US); Quanwang Liu, Sichuan (CN); Shiqiang Liu, Shenzhen (CN); Juncai Hu, Sichuan (CN)

(73) Assignee: O2Micro International Limited, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 13/242,307

(22) Filed: Sep. 23, 2011

(65) Prior Publication Data

US 2012/0013366 A1   Jan. 19, 2012

Related U.S. Application Data

(63) Continuation of application No. 12/649,001, filed on Dec. 29, 2009, now Pat. No. 8,030,973.

(51) Int. Cl.
*H03L 5/00* (2006.01)

(52) U.S. Cl. ............................................. 327/307; 330/9

(58) Field of Classification Search .................. 327/307; 330/9
See application file for complete search history.

(56) References Cited

U.S. PATENT DOCUMENTS

| | | | | |
|---|---|---|---|---|
| 5,764,103 | A * | 6/1998 | Burra et al. | 330/51 |
| 6,323,650 | B1 | 11/2001 | Bertness et al. | |
| 6,459,335 | B1 * | 10/2002 | Darmawaskita et al. | 330/9 |
| 6,534,993 | B2 | 3/2003 | Bertness | |
| 6,724,248 | B2 * | 4/2004 | Llewellyn | 330/9 |
| 6,909,287 | B2 | 6/2005 | Bertness | |
| 7,304,534 | B2 * | 12/2007 | Koller et al. | 330/9 |
| 7,352,155 | B2 | 4/2008 | Li et al. | |
| 7,679,369 | B2 | 3/2010 | Hartzog et al. | |
| 7,696,725 | B2 | 4/2010 | Liu et al. | |
| 7,786,701 | B2 | 8/2010 | Altemose | |
| 7,924,088 | B1 * | 4/2011 | Chiang et al. | 330/9 |
| 7,973,684 | B2 * | 7/2011 | Nolan et al. | 341/118 |
| 8,030,973 | B2 * | 10/2011 | Li et al. | 327/72 |

* cited by examiner

*Primary Examiner* — Kenneth B. Wells

(57) ABSTRACT

In a signal monitoring system, a circuit includes an input terminal and an output terminal. In addition, a processor coupled to the circuit is operable for calculating a parameter indicative of an error factor of the circuit by setting a level difference between an input signal at the input terminal and an output signal at the output terminal to a predetermined level.

24 Claims, 6 Drawing Sheets

CALIBRATING A SYSTEM BY SETTING DIFFERENCE BETWEEN SIGNALS

RELATED UNITED STATES PATENT APPLICATION

This application is a Continuation Application of U.S. patent application Ser. No. 12/649,001, filed on Dec. 29, 2009 (now U.S. Pat. No. 8,030,973 issued on Oct. 4, 2011), which is hereby incorporated by reference in its entirety.

BACKGROUND

A conventional battery monitoring system for monitoring voltages of a set of cells can include a multiplexer and an analog-to-digital converter (ADC). The multiplexer is coupled to the set of cells and sequentially shifts each cell voltage to one or more analog signals. The ADC converts the analog signals to corresponding digital signals. Simply put, the monitoring system can monitor the cell voltages and generate the corresponding digital signals to represent the cell voltages.

However, in practice, the ADC and the multiplexer may introduce errors into the shifting process. In some conventional battery monitoring systems, the error caused by the ADC is calibrated by the ADC itself. However, the error caused by the multiplexer varies with changes in the ambient conditions (e.g., the ambient temperature, etc.), and reduces the accuracy of the outputs of conventional battery cell voltage monitoring systems.

SUMMARY

In one embodiment, a signal monitoring system includes a circuit and a processor. The circuit includes an input terminal and an output terminal. The processor coupled to the circuit is operable for calculating a parameter indicative of an error factor of the circuit by setting a level difference between an input signal at the input terminal and an output signal at the output terminal to a predetermined level.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

In one embodiment, the present invention provides a signal monitoring system that can, for example, monitor a voltage across each cell of a set of battery cells. In one such embodiment, the signal monitoring system operates a self-calibration process, so that the signal monitoring system monitors the cell voltages of the battery cells more accurately. More specifically, the signal monitoring system calculates one or more parameters indicative of one or more error factors of the signal monitoring system. The signal monitoring system calculates the cell voltages of the battery cells based on the calculated parameters.

Figure 1A:
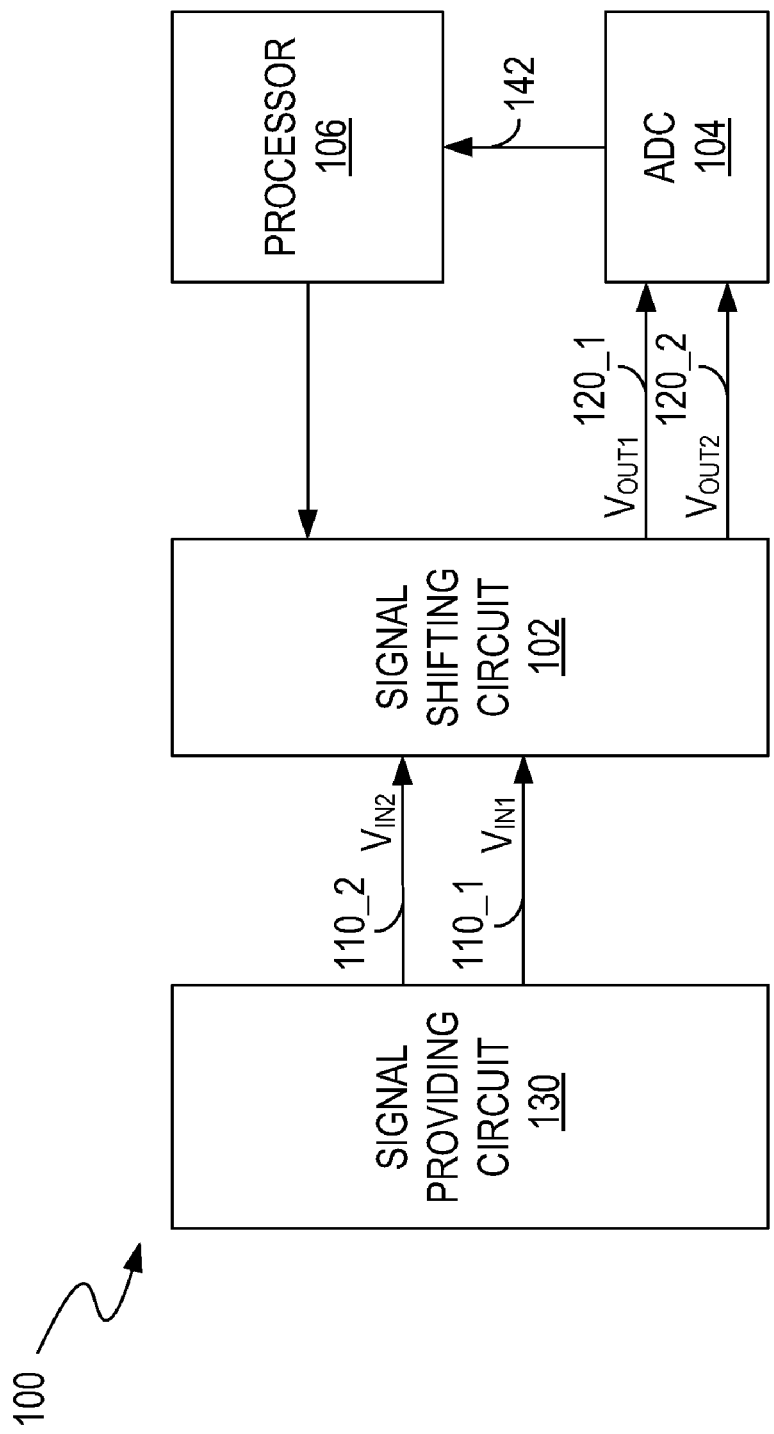
FIG. 1A illustrates a block diagram of an example of a signal monitoring system, in accordance with one embodiment of the present invention.

FIG. 1A illustrates a block diagram of an example of a signal monitoring system 100, in accordance with one embodiment of the present invention. In one such embodiment, the signal monitoring system 100 includes a signal providing circuit 130, a signal shifting circuit 102, a power converter, e.g., an analog-to-digital converter (ADC) 104, and a processor 106.

The signal shifting circuit 102 includes a first input terminal 110_1, a second input terminal 1102, a first output terminal 120_1, and a second output terminal 120_2. The signal shifting circuit 102 receives a first input signal, e.g., a voltage level $V_{IN1}$, and a second input signal, e.g., a voltage level $V_{IN2}$, from the signal providing circuit 130 via the first input terminal 110_1 and the second input terminal 1102, respectively. The shifting circuit 102 further shifts the input signals $V_{IN1}$ and $V_{IN2}$ to a first output signal, e.g., a voltage level $V_{OUT1}$, and a second output signal, e.g., a voltage level $V_{OUT2}$, and provides the output signals $V_{OUT1}$ and $V_{OUT2}$ to the ADC 104 via the first output terminal 120_1 and the second output terminal 120_2, respectively. The ADC 104 therefore provides a digital signal 142 to the processor 106. The digital signal 142 indicates a level difference between the first output signal $V_{OUT1}$ and the second output signal $V_{OUT2}$. The ADC 104 can also generate digital signals (not shown in FIG. 1A) indicative of the level of the first output signal $V_{OUT1}$ and the level of the second output signal $V_{OUT2}$. The processor 106 receives the digital signal 142 and calculates a level difference between the first input signal $V_{IN1}$ and the second input signal $V_{IN2}$ based on the digital signal 142. The processor 106 can also calculate the level of the first input signal $V_{IN1}$ and/or the level of the second input signal $V_{IN2}$.

In one embodiment, the signal shifting circuit 102 has one or more error factors. For example, the signal shifting circuit 102 may have an error factor caused by resistor mismatch in the signal shifting circuit 102. The signal shifting circuit 102 may also have an error factor, e.g., a voltage offset, that varies as an ambient condition varies. The ambient condition includes the ambient temperature, etc. Thus, in one such embodiment, the level difference between the first output signal $V_{OUT1}$ and the second output signal $V_{OUT2}$ is determined by the error factors and the level difference between the first input signal $V_{IN1}$ and the second input signal $V_{IN2}$. Advantageously, the processor 106 coupled to the signal shifting circuit 102 can calculate one or more parameters indicative of the error factors of the signal shifting circuit 102. Specifically, by setting the level difference between the first input signal $V_{IN1}$ and the first output signal $V_{OUT1}$ to a first predetermined level $V_{PRE1}$ (e.g., $V_{IN1}-V_{OUT1}=V_{PRE1}$), and setting the level difference between the second input signal $V_{IN2}$ and the first input signal $V_{IN1}$ to a second predetermined level $V_{PRE2}$ (e.g., $V_{IN2}-V_{IN1}=V_{PRE2}$), the processor 106 calculates the parameters indicative of the error factors. As a result, the processor 106 calculates a real-time level difference between the first input signal $V_{IN1}$ and the second input signal $V_{IN2}$ according to the parameters, and according to a real-time level difference between the first output signal $V_{OUT1}$ and the second output signal $V_{OUT2}$.

Figure 1B:
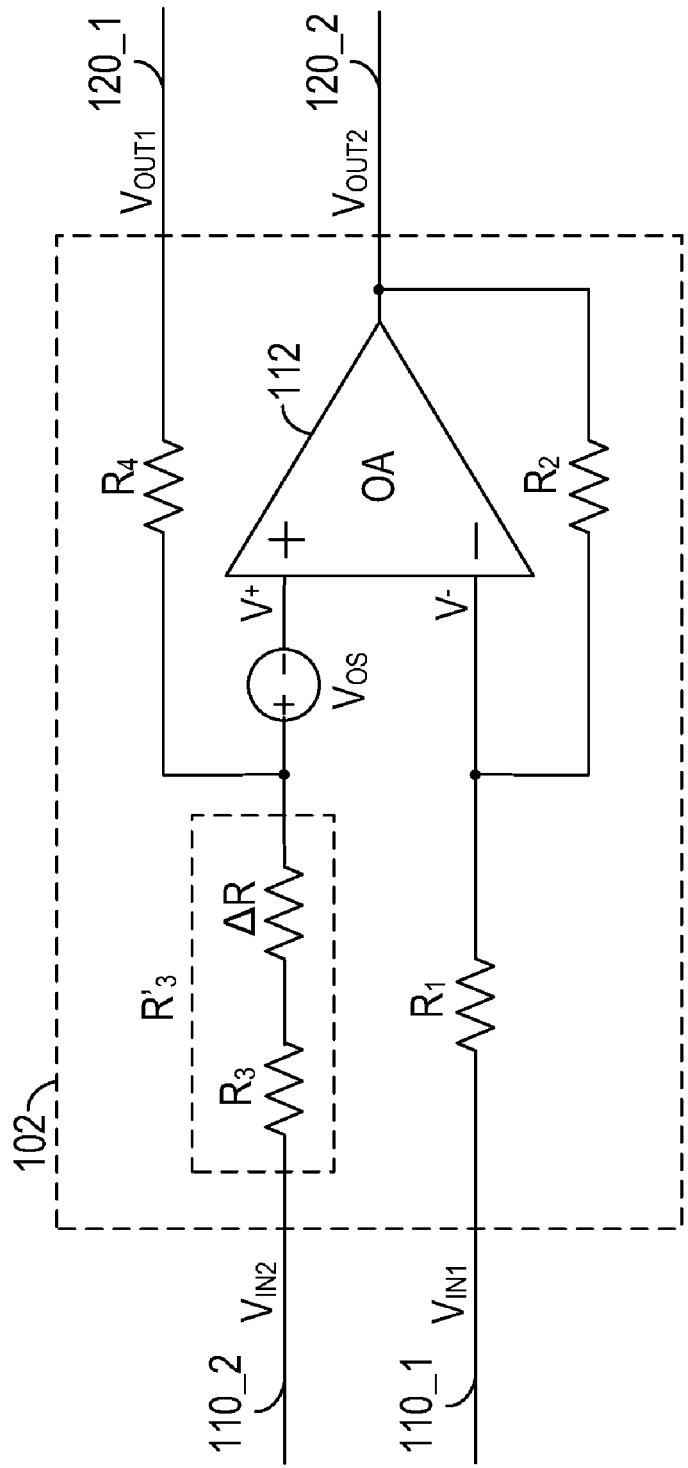
FIG. 1B illustrates a circuit diagram of an example of a signal shifting circuit, in accordance with one embodiment of the present invention.

FIG. 1B illustrates a circuit diagram of an example of the signal shifting circuit 102, in accordance with one embodiment of the present invention. Elements that are labeled the same as in FIG. 1A have similar functions.

As shown in FIG. 1B, the signal shifting circuit 102 includes an operational amplifier (OA) 112. An input terminal, e.g., a negative input terminal, of the OA 112 is coupled to the first input terminal 110_1 via a resistor $R_1$ and to the second output terminal 120_2 via a resistor $R_2$. Another input terminal, e.g., a positive input terminal, of the OA 112 is coupled to the second input terminal 110_2 via a resistor $R'_3$ and to the first output terminal 120_1 via a resistor $R_4$. In addition, an output terminal of the OA 112 is coupled to the second output terminal 120_2. In one such embodiment, the resistor $R_1$ has a resistance $R_1$, the resistor $R_2$ has a resistance $R_2$, the resistor $R'_3$ has a resistance $R_3$ and a resistance $\Delta R$ (e.g., $R'_3=R_3+\Delta R$), and the resistor $R_4$ has a resistance $R_4$. The resistance $\Delta R$ represents a resistance error caused by resistor mismatch in the signal shifting circuit 102. In addition, a parameter $V_{OS}$ represents an error factor, e.g., an input voltage offset, of a practical OA 112. The value of the parameter $V_{OS}$ varies as an ambient condition, e.g., ambient temperature, varies.

In one such embodiment, the OA 112 shown in FIG. 1 is assumed to be an ideal OA. Thus, a voltage level $V^+$ at the positive input terminal of the OA 112 is equal to a voltage level $V^-$ at the negative input terminal of the OA 112, e.g., $V^+=V^-$. The following equation is obtained:

$$(V_{OUT2} - V_{IN1}) \times \frac{R_1}{R_1 + R_2} + V_{IN1} = \qquad (1)$$

$$(V_{OUT1} - V_{IN2}) \times \frac{R'_3}{R'_3 + R_4} + V_{IN2} - V_{OS}.$$

Assume that $K_1$ is a resistance ratio that is equal to $R_1/(R_1+R_2)$, $K_2$ is a resistance ratio that is equal to $R'_3/(R'_3+R_4)$, and $K_3$ is a resistance ratio that is equal to $K_2/K_1$. Equation (1) can be rewritten as:

$$(V_{OUT2}-V_{IN1}) \times K_1 + V_{IN1} = (V_{OUT1}-V_{IN2}) \times K_2 + V_{IN2} - V_{OS}. \qquad (2)$$

Equation (2) can be further rewritten as:

$$V_{OUT2} - V_{OUT1} = (V_{OUT1} - V_{IN2}) \times \frac{K_2}{K_1} + \frac{V_{IN2}}{K_1} - \frac{V_{OS}}{K_1} - \frac{V_{IN1}}{K_1} +$$

$$V_{IN1} - V_{OUT1}$$

-continued $$= V_{IN2} \times \left(\frac{1}{K_1} - K_3\right) - V_{OUT1} \times (1 - K_3) +$$

$$V_{IN1} \times \left(1 - \frac{1}{K_1}\right) - \frac{V_{OS}}{K_1}$$

$$= (V_{IN2} - V_{IN1}) \times \left(\frac{1}{K_1} - K_3\right) + (V_{IN1} - V_{OUT1}) \times$$

$$(1 - K_3) - \frac{V_{OS}}{K_1}.$$

That is:

$$V_{OUT2} - V_{OUT1} = \qquad (3)$$

$$(V_{IN2} - V_{IN1}) \times \left(\frac{1}{K_1} - K_3\right) + (V_{IN1} - V_{OUT1}) \times (1 - K_3) - \frac{V_{OS}}{K_1}.$$

Assume that $K_4$ is a resistance ratio that is equal to $1/K_1 - K_3$, and $K_5$ is a resistance ratio that is equal to $1-K_3$. The voltage level difference $V_{OUT2}-V_{OUT1}$ between the first output terminal 120_1 and the second output terminal 120_2 is given by:

$$V_{OUT2} - V_{OUT1} = (V_{IN2} - V_{IN1}) \times K_4 + (V_{IN1} - V_{OUT1}) \times K_5 - \frac{V_{OS}}{K_1}. \qquad (4)$$

Equation (4) defines a relationship between voltage levels $V_{IN1}$, $V_{IN2}$, $V_{OUT1}$, and $V_{OUT2}$ at the first input terminal 110_1, the second input terminal 1102, the first output terminal 120_1, and the second output terminal 120_2, respectively. Additionally, equation (4) is determined by the parameter $V_{OS}$ and the parameters $K_1$, $K_4$ and $K_5$. The term $V_{OS}/K_1$ includes the error factor $V_{OS}$ that varies as the ambient condition varies. The resistance ratios $K_4$ and $K_5$ include the error factor $\Delta R$ caused by resistor mismatch in the signal shifting circuit 102.

Advantageously, the processor 106 in FIG. 1A can calculate the parameters $V_{OS}$, $K_1$, $K_4$ and $K_5$. Specifically, the processor 106 can set the voltage level difference $V_{IN1}-V_{OUT1}$ to a first predetermined level $V_{PRE1}$ (e.g., $V_{IN1}-V_{OUT1}=V_{PRE1}$) and set the voltage level difference $V_{IN2}-V_{IN1}$ to a second predetermined level $V_{PRE2}$ (e.g., $V_{IN2}-V_{IN1}=V_{PRE2}$). Meanwhile, the processor 106 measures a voltage level difference $V_{OUT2}-V_{OUT1}$ via the ADC 104. Based on the measured voltage level difference $V_{OUT2}-V_{OUT1}$ and the predetermined levels $V_{PRE1}$ and $V_{PRE2}$, the processor 106 calculates the parameters $V_{OS}$, $K_1$, $K_4$ and $K_5$. As a result, the processor 106 evaluates equation (4).

Figure 2:
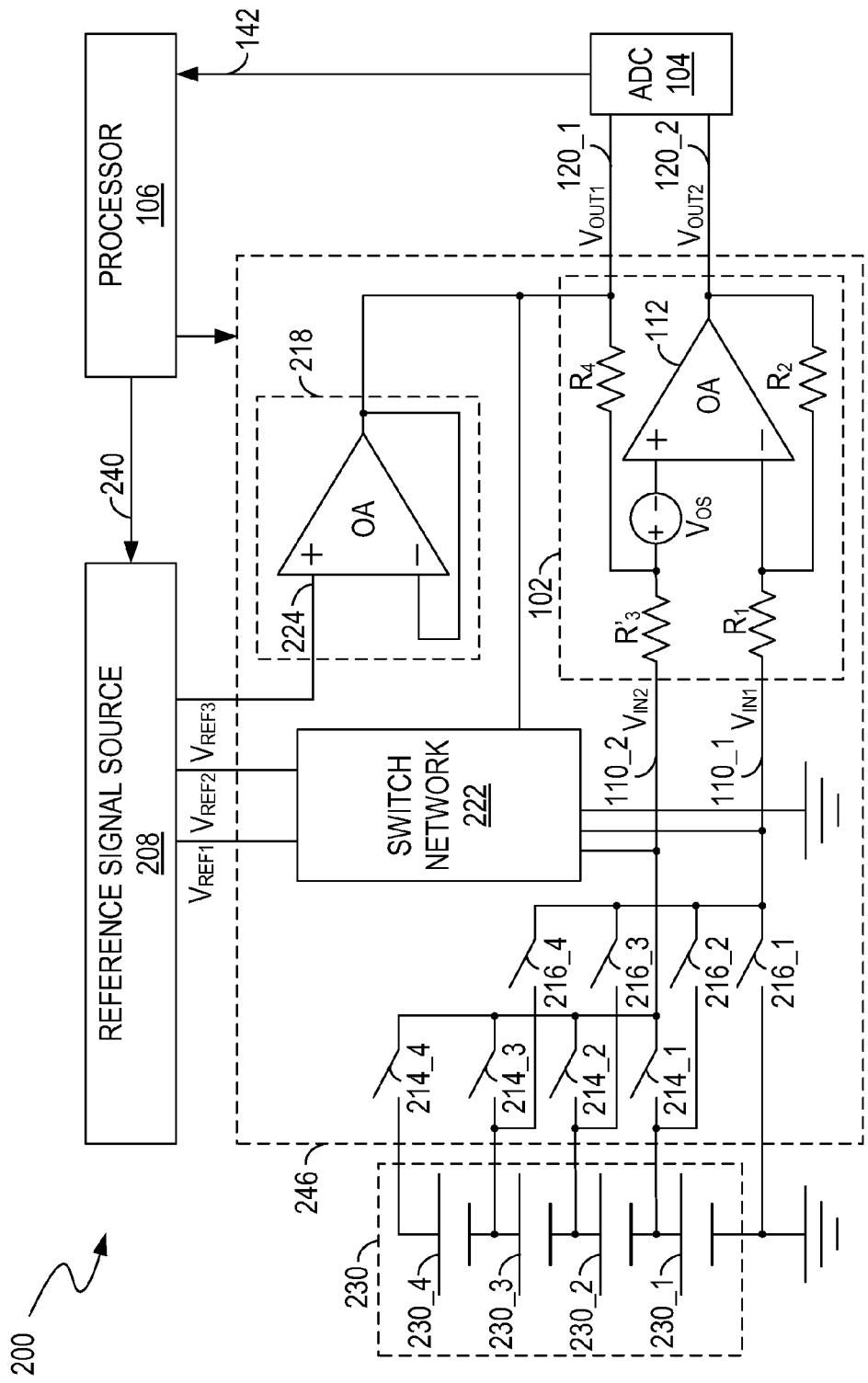
FIG. 2 illustrates a circuit diagram of an example of a battery monitoring system, in accordance with one embodiment of the present invention.

FIG. 2 illustrates a circuit diagram of an example of a battery monitoring system 200, in accordance with one embodiment of the present invention. Elements that are labeled the same as in FIG. 1A and FIG. 1B have similar functions. The battery monitoring system 200 includes a battery pack 230, a multiplexer 246, the ADC 104, the processor 106 and a reference signal source 208.

In one such embodiment, the battery pack 230 includes a set of cells 230_1, 230_2, 230_3 and 230_4. In the example of FIG. 2, the battery pack 230 includes four cells 230_1-230_4. However, the battery pack 230 is not so limited. The battery pack 230 can include any number of cells. The multiplexer 246 includes multiple switches 214_1, 214_2, 214_3, 214_4, 216_1, 216_2, 216_3 and 216_4 coupled between the set of cells 230_1-230_4 and the first and second input terminal 110_1 and 110_2. The multiplexer 246 further includes the signal shifting circuit 102, a buffer 218, and a switch network 222. The multiplexer 246 is controlled by the processor 106.

The multiplexer 246 is operable for providing a first selected signal and a second selected signal that are selected from a first reference signal, a second reference signal, and a set of real-time input signals to the first input terminal 110_1 and the second input terminal 110_2. The first and second reference signals can be reference voltages $V_{REF1}$ and $V_{REF2}$ from the reference signal source 208. The first and second reference signals can also be zero-volt voltage from ground. Furthermore, the first input signal $V_{IN1}$ can be equal to the first output signal $V_{OUT1}$, e.g., by connecting the first input terminal 110_1 to the first output terminal 120_1. The set of real-time input signals is a set of voltage levels from the set of cells 230_1-230_4. Specifically, each real-time input signal in the set of real-time input signals is a voltage level at a terminal of a corresponding cell of the cells 230_1-230_4.

More specifically, the multiple switches 214_1-214_4 and 216_1-216_4 are coupled between the set of cells 230_1-230_4 and the first and second input terminal 110_1 and 110_2. By turning on a switch 216_n of the switches 216_1-216_4 (n=1, 2, 3, or 4), the signal shifting circuit 102 receives a first voltage level $V_L(n)$ at a first detect terminal, e.g., a negative terminal of the cell 230__n, via the first input terminal 110_1. Similarly, by turning on the switch 214__n of the switches 214_1-214_4, the signal shifting circuit 102 receives a second voltage level $V_H(n)$ at a second detect terminal, e.g., a positive terminal of the cell 230__n, via the second input terminal 110_2.

The switch network 222 includes multiple switches (not shown in FIG. 2). For example, the switch network 222 may include a switch coupled between the first input terminal 110_1 and the reference signal source 208, and/or a switch coupled between the second input terminal 110_2 and the reference signal source 208. The switch network 222 may also include a switch coupled between the first input terminal 110_1 and ground, and/or a switch coupled between the second input terminal 1102 and ground. The switch network 222 may also include a switch coupled between the first and second input terminals 110_1 and 110_2. The switch network 222 may further include a switch coupled between the first output terminal 120_1 and the first input terminal 110_1. The switch network 222 can have many different configurations.

The first input terminal 110_1 and the second input terminal 1102 can receive the reference voltages $V_{REF1}$ and $V_{REF2}$ by turning on corresponding switches in the switch network 222. The first input terminal 110_1 and the second input terminal 110_2 can also receive zero-volt voltage from ground by turning on corresponding switches in the switch network 222. In addition, the first input terminal 110_1 can receive the first output signal $V_{OUT1}$ from the first output terminal 120_1 by turning on a corresponding switch in the switch network 222.

As shown in FIG. 2, the buffer 218 has an output terminal coupled to the first output terminal 120_1. The butter 218 can be, but is not limited to, an operational amplifier. The operational amplifier 218 includes an input terminal 224 (e.g., a positive terminal) that receives a reference voltage $V_{REF3}$, and another input terminal (e.g., a negative terminal) that is coupled to the output terminal of the operational amplifier 218. Thus, the buffer 218 can set the first output signal $V_{OUT1}$ approximately equal to the reference voltage $V_{REF3}$. The operational amplifier 218 may have a relatively small input voltage offset, therefore a level of the first output signal $V_{OUT1}$ is within a relatively small range centered at the voltage level $V_{REF3}$. The voltage level difference $V_{OUT2}-V_{OUT1}$ can be with respect to a relatively stable voltage level, e.g., $V_{OUT1}$. In the example of FIG. 2, the reference signal source 208 provides three reference voltages $V_{REF1}$, $V_{REF2}$, and $V_{REF3}$. However, the reference signal source 208 can provide any number of reference voltages. In addition, in the example of FIG. 2, the multiplexer 246 includes the buffer 218. However, in another embodiment, the first output terminal 120_1 is grounded, and the buffer 218 is omitted.

Figure 3:
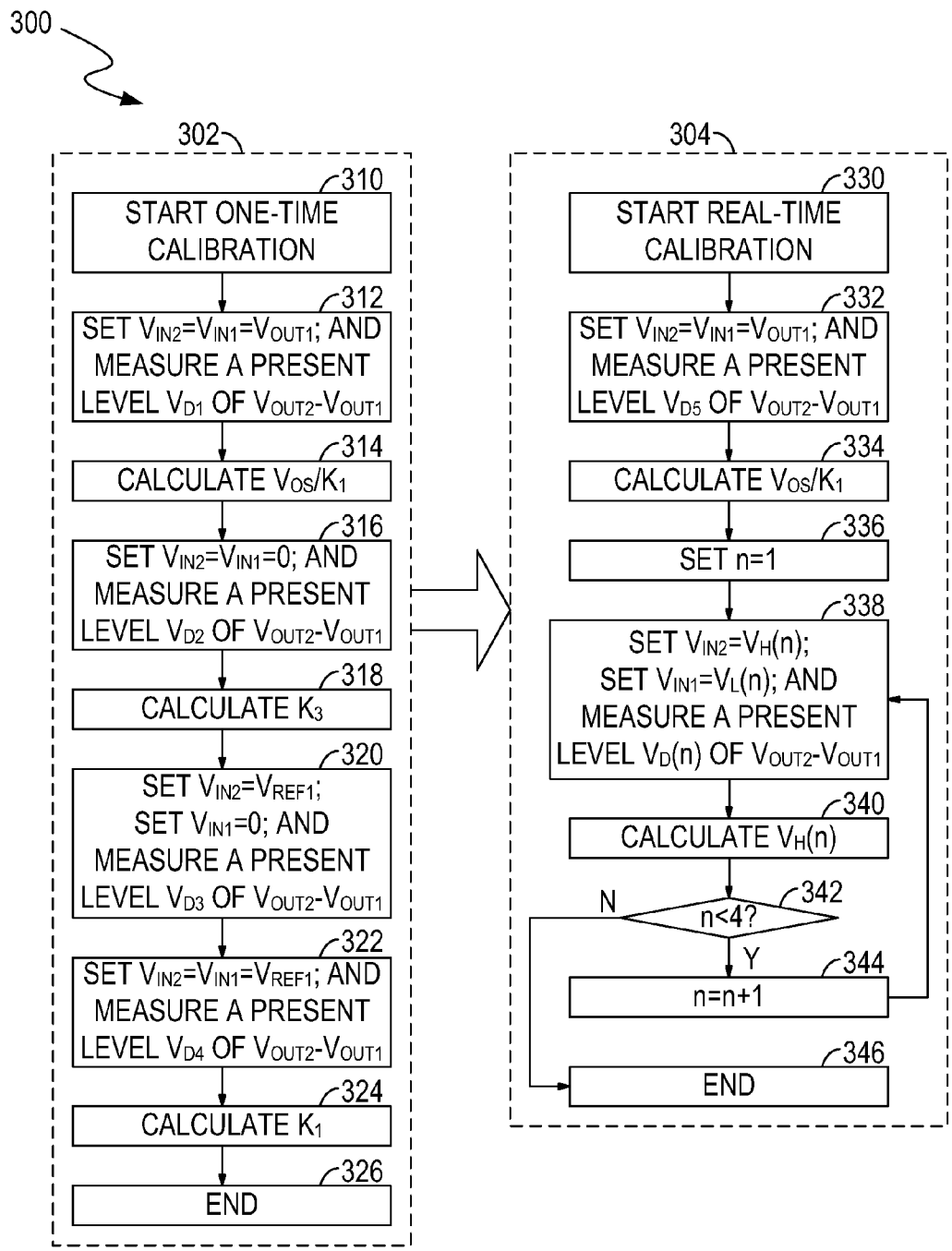
FIG. 3 illustrates a flowchart of examples of operations performed by a battery monitoring system, in accordance with one embodiment of the present invention.

FIG. 3 illustrates a flowchart of examples of operations performed by the battery monitoring system 200, in accordance with one embodiment of the present invention. FIG. 3 is described in combination with FIG. 1A, FIG. 1B and FIG. 2. As shown in FIG. 3, block 302 illustrates a flowchart for a one-time calibration process performed by the battery monitoring system 200. Block 304 illustrates a flowchart for a real-time calibration process performed by the battery monitoring system 200. The onetime calibration process and the real-time calibration process are performed based on equations (3) and (4).

Specifically, during the one-time calibration process, the parameters $K_4$ and $K_5$ are obtained/calculated by the processor 106. The calculated values of the parameters $K_4$ and $K_5$ are stored in a data memory in the processor 106. In one embodiment, the error factor caused by the resistor mismatch can be constant when the ambient condition varies. In other words, the values of the parameters $K_4$ and $K_5$ can be constant when the ambient condition varies. Thus, the processor 106 can, but does not necessarily, perform the calibration process just a single time. For example, the onetime calibration process is performed when the signal shifting circuit 102 is used in combination with the processor 106 for the first time. However, the one-time calibration process can also be performed at anytime.

During the real-time calibration process, the term $V_{OS}/K_1$ is obtained/calculated by the processor 106. Since the error factor $V_{OS}$ varies as the ambient condition varies, the processor 106 performs the real-time calibration process at the beginning of a battery monitoring process. The processor 106 obtains a present value (or a real-time value) of the term $V_{OS}/K_1$, so as to calculate cell voltages of the cells 230_1-230_4 more accurately.

More specifically, in block 310, the battery monitoring system 200 starts the one-time calibration process. In block 312, the battery monitoring system 200 sets $V_{IN2}=V_{IN1}=V_{OUT1}$ and measures a present level $V_{D1}$ of $V_{OUT2}-V_{OUT1}$. For example, the multiplexer 246 turns on corresponding switches in the switch network 222, such that the first input terminal 110_1 and the second input terminal 1102 are connected to the first output terminal 120_1. As such, the first output signal $V_{OUT1}$ is transferred to the first input terminal 110_1 and the second input terminal 1102, so as to set the first input signal $V_{IN1}$ and the second input signal $V_{IN2}$ equal to the first output signal $V_{OUT1}$. Meanwhile, the processor 106 measures/obtains a present voltage level difference $V_{D1}$ between the output terminals 120_1 and 120_2, e.g., $V_{D1}=V_{OUT2}-V_{OUT1}$, via the ADC 104.

Thus, based on equation (3), the following equation is obtained:

$$V_{D1} = -\frac{V_{OS}}{K_1}. \qquad (5)$$

In other words, as described in block 314, the processor 106 calculates the value of the term $V_{OS}/K_1$. If the value of the parameter $K_1$ is known, e.g., $K_1$=0.6667±5%, the processor 106 can also calculate the voltage offset $V_{OS}$ as: $V_{OS}$=$V_{D1}$* (0.6667±5%).

In block 316, the battery monitoring system 200 sets $V_{IN2}$=$V_{IN1}$=0 and measures a present level $V_{D2}$ of $V_{OUT2}$-$V_{OUT1}$. For example, the multiplexer 246 turns on corresponding switches in the switch network 222, such that the input terminals 110_1 and 110_2 are grounded. Meanwhile, the processor 106 measures/obtains a present voltage level difference $V_{D2}$ between the output terminals 120_1 and 120_2, e.g., $V_{D2}$=$V_{OUT2}$-$V_{OUT1}$, via the ADC 104. The processor 106 also measures/obtains a present voltage level $V_1$ of the first output signal $V_{OUT1}$, e.g., $V_1$=$V_{OUT1}$. Thus, based on equations (3) and (5), the following equation is obtained:

$$V_{D2} = V_1 \times (1-K_3) + V_{D1}. \quad (6)$$

As described in block 318, the parameter $K_3$ is calculated:

$$K_3 = 1 - \frac{V_{D1} - V_{D2}}{V_1}. \quad (7)$$

In block 320, the battery monitoring system 200 sets $V_{IN2}$=$V_{REF1}$, sets $V_{IN1}$=0, and measures a present level $V_{D3}$ of $V_{OUT2}$-$V_{OUT1}$. For example, the multiplexer 246 turns on corresponding switches in the switch network 222, such that the second input terminal 110_2 receives the reference voltage $V_{REF1}$, and the first input terminal 110_1 is grounded. Meanwhile, the processor 106 measures/obtains a present voltage level difference $V_{D3}$ between the output terminals 120_1 and 120_2, e.g., $V_{D3}$=$V_{OUT2}$-$V_{OUT1}$, via the ADC 104. Since the one-time calibration process takes a relatively short time, the voltage level of the first output signal $V_{OUT1}$ is considered to be constant, e.g., $V_{OUT1}$=$V_1$, during the one-time calibration process. Thus, based on equations (3) and (5), the following equation is obtained:

$$V_{D3} = V_{REF1} \times (1/K_1 - K_3) - V_1 \times (1-K_3) \pm V_{D1}. \quad (8)$$

In block 322, the battery monitoring system 200 sets $V_{IN2}$=$V_{IN1}$=$V_{REF1}$ and measures a present level $V_{D4}$ of $V_{OUT2}$-$V_{OUT1}$. For example, the multiplexer 246 turns on corresponding switches in the switch network 222, such that the input terminals 110_1 and 110_2 receive the reference voltage $V_{REF1}$. Meanwhile, the processor 106 measures/obtains a present voltage level difference $V_{D4}$ between the output terminals 120_1 and 120_2, e.g., $V_{D4}$=$V_{OUT2}$-$V_{OUT1}$, via the ADC 104. Based on equations (3) and (5), the following equation is obtained:

$$V_{D4} = (V_{REF1} - V_1) \times (1-K_3) + V_{D1}. \quad (9)$$

Based on equations (8) and (9), the following equation is obtained:

$$V_{D3} - V_{D4} = V_{REF1} \times (1/K_1 - 1). \quad (10)$$

As described in block 324, the parameter $K_1$ is calculated:

$$K_1 = \frac{V_{REF1}}{V_{REF1} + V_{D3} - V_{D4}}. \quad (11)$$

As a result, the processor 106 calculates the parameters $K_4$ and $K_5$ (e.g., $K_4$=1/$K_1$-$K_3$, $K_5$=1-$K_3$), and stores the values of the parameters $K_4$ and $K_5$ into a data memory in the processor 106. The flowchart 302 goes to block 326 to end the one-time calibration process.

When the battery monitoring system 200 starts to monitor the cell voltages of the cells 230_1-230_4, the battery monitoring system 200 performs the real-time calibration process. In block 330, the battery monitoring system 200 starts the real-time calibration process. In block 332, the battery monitoring system 200 performs similar operations as described in relation to block 312. The battery monitoring system 200 sets $V_{IN2}$=$V_{IN1}$=$V_{OUT1}$ and measures a present level (or a real-time level) $V_{D5}$ of $V_{OUT2}$-$V_{OUT1}$. Based on equation (3), the following equation is obtained:

$$V_{D5} = -\frac{V_{OS}}{K_1}. \quad (12)$$

In block 334, the processor 106 calculates/obtains the value of the term $V_{OS}/K_1$, e.g., $V_{OS}/K_1$=-$V_{D5}$.

In block 336, the processor 106 sets n=1. In block 338, the battery monitoring system 200 sets $V_{IN2}$=$V_H(n)$, sets $V_{IN1}$=$V_L(n)$, and measures a present level (or a real-time level) $V_D(n)$ of $V_{OUT2}$-$V_{OUT1}$. Specifically, the parameter n represents a sequential number of the cells 230_1-230_4 (e.g., n=1, 2, 3, 4). The voltage level $V_H(n)$ represents a voltage level at a positive terminal of the cell 230_$n$, and the voltage level $V_L(n)$ represents a voltage level at a negative terminal of the cell 230_$n$. For example, when n=1, the processor 106 turns on the switches 214_1 and 216_1, such that $V_{IN2}$=$V_H(1)$ and $V_{IN1}$=$V_L(1)$. Meanwhile, the processor 106 measures/obtains a present voltage level difference $V_D(1)$ between the output terminals 120_1 and 120_2, e.g., $V_D(1)$=$V_{OUT2}$-$V_{OUT1}$, via the ADC 104.

Thus, based on equation (4), the following equation is obtained:

$$V_D(1) = [V_H(1) - V_L(1)] \times K_4 + [V_L(1) - V_{OUT1}] \times K_5 + V_{D5}. \quad (13)$$

In equation (13), the voltage level $V_L(1)$ is zero volts since the negative terminal of the cell 230_1 is grounded. Additionally, a voltage level of the first output signal $V_{OUT1}$ is measured/obtained, e.g., $V_{OUT1}$=$V_2$, and is considered to be constant during the real-time calibration process. Thus, as described in block 340, the voltage level $V_H(1)$ can be calculated:

$$V_H(1) = \frac{V_D(1) - V_{D5} + V_2 \times K_5}{K_4}. \quad (14)$$

The voltage across the cell 230_1 is equal to $V_H(1)$-$V_L(1)$=$V_H(1)$.

In block 342, the processor 106 compares the number n with the number (e.g., 4) of cells 230_1-230_4. If the number n is less than the number (e.g., 4) of cells 230_1-230_4, the flowchart 304 goes to block 344. In block 344, the processor 106 increases the value of the number n by one. The flowchart 304 goes to block 338 and then block 340. Similarly, the processor 106 turns on the switches 214_2 and 216_2, such that $V_{IN2}$=$V_H(2)$ and $V_{IN1}$=$V_L(2)$. Meanwhile, the processor 106 measures/obtains a present voltage level difference $V_D(2)$ between the output terminals 120_1 and 120_2, e.g., $V_D(2)$=$V_{OUT2}$-$V_{OUT1}$, via the ADC 104. The following equation is obtained:

$$V_D(2) = [V_H(2) - V_L(2)] \times K_4 + [V_L(2) - V_2] \times K_5 + V_{D5}. \quad (15)$$

In equation (15), the voltage level $V_L(2)$ is the voltage level $V_H(1)$. Thus, the voltage level $V_H(2)$ is calculated:

$$V_H(2) = \frac{V_D(2) - V_{D5} - [V_H(1) - V_2] \times K_5}{K_4} + V_H(1). \quad (16)$$

The voltage across the cell 230_2 is equal to $V_H(2) - V_L(2) = V_H(2) - V_H(1)$. By repeating the operations in blocks 344, 338 and 340, all the cell voltages respectively across the cells 230_1-230_4 are calculated.

Turning to block 342, if the number n is equal to the number (e.g., 4) of cells 230_1-230_4, the flowchart 304 goes to block 346 to end the real-time calibration process. Advantageously, the processor 106 can calculate a real-time value of the term $V_{OS}/K_1$ right before each round of battery monitoring process. Thus, the processor 106 can calculate the cell voltages of the cells 230_1-230_4 more accurately.

Figure 4:
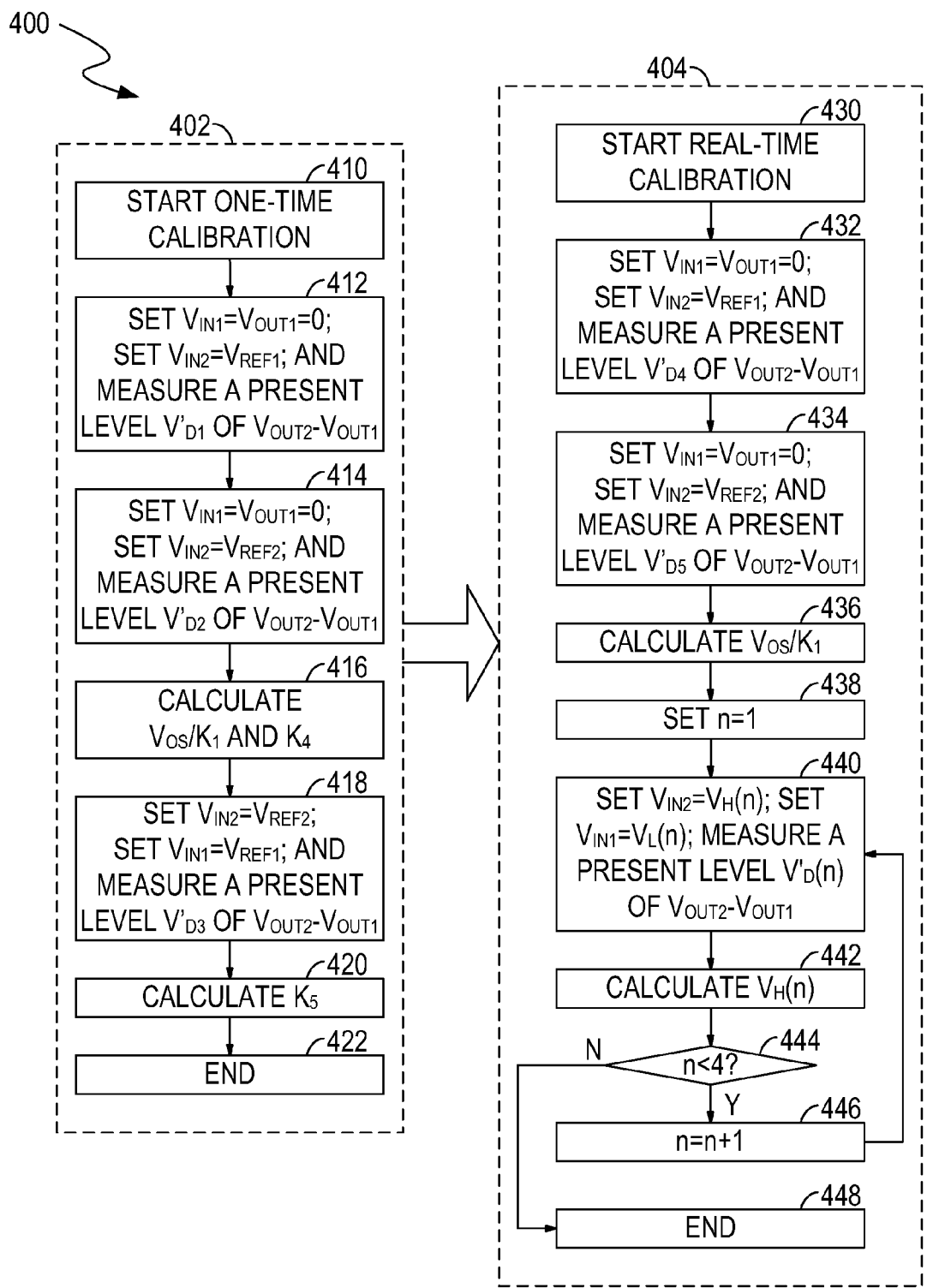
FIG. 4 illustrates a flowchart of examples of operations performed by a battery monitoring system, in accordance with one embodiment of the present invention.

FIG. 4 illustrates another flowchart of examples of operations performed by the battery monitoring system 200, in accordance with one embodiment of the present invention. FIG. 4 is described in combination with FIG. 1A, FIG. 1B and FIG. 2. As shown in FIG. 4, block 402 illustrates a flowchart for a one-time calibration process, and block 404 illustrates a flowchart for a real-time calibration process. The one-time calibration process and the real-time calibration process are performed based on equation (4). In one such embodiment, the signal shifting circuit 102 is configured to have a single output. Specifically, the first output terminal 120_1 is grounded, and the buffer 218 is omitted.

In block 410, the battery monitoring system 200 starts the one-time calibration process. In block 412, the battery monitoring system 200 sets $V_{IN1} = V_{OUT1} = 0$, sets $V_{IN2} = V_{REF1}$, and measures a present level $V'_{D1}$ of $V_{OUT2} - V_{OUT1}$. For example, the multiplexer 246 turns on corresponding switches in the switch network 222, such that the first input terminal 110_1 is grounded, and the second input terminal 110_2 receives the reference voltage $V_{REF1}$. Meanwhile, the processor 106 measures/obtains a present voltage level difference $V'_{D1}$ between the output terminals 120_1 and 120_2, e.g., $V'_{D1} = V_{OUT2} - V_{OUT1}$, via the ADC 104. Similarly, in block 414, the battery monitoring system 200 sets $V_{IN1} = V_{OUT1} = 0$, sets $V_{IN2} = V_{REF2}$, and measures a present level $V'_{D2}$ of $V_{OUT2} - V_{OUT1}$. The multiplexer 246 turns on a corresponding switch in the switch network 222, such that the second input terminal 110_2 receives the reference voltage $V_{REF2}$. Meanwhile, the processor 106 measures/obtains a present voltage level difference $V'_{D2}$ between the output terminals 120_1 and 120_2, e.g., $V'_{D2} = V_{OUT2} - V_{OUT1}$, via the ADC 104.

Thus, based on equation (4), the following equations are obtained:

$$V'_{D1} = V_{REF1} \times K_4 - \frac{V_{OS}}{K_1}; \quad (17a)$$

$$V'_{D2} = V_{REF2} \times K_4 - \frac{V_{OS}}{K_1}. \quad (17b)$$

As described in block 416, the parameter $K_4$ and the term $V_{OS}/K_1$ are calculated:

$$K_4 = \frac{V'_{D1} - V'_{D2}}{V_{REF1} - V_{REF2}}; \quad (18a)$$

$$\frac{V_{OS}}{K_1} = \frac{V_{REF2} \times V'_{D1} - V_{REF1} \times V'_{D2}}{V_{REF1} - V_{REF2}}. \quad (18b)$$

In block 418, the battery monitoring system 200 sets $V_{IN2} = V_{REF2}$, sets $V_{IN1} = V_{REF1}$, and measures a present level $V'_{D3}$ of $V_{OUT2} - V_{OUT1}$. For example, the multiplexer 246 turns on corresponding switches in the switch network 222, such that the second input terminal 110_2 receives the reference voltage $V_{REF2}$, and the first input terminal 110_1 receives the reference voltage $V_{REF1}$. Meanwhile, the processor 106 measures/obtains a present voltage level difference $V'_{D3}$ between the output terminals 120_1 and 120_2, e.g., $V'_{D2} = V_{OUT2} - V_{OUT1}$, via the ADC 104.

Thus, based on equation (4), the following equations are obtained:

$$V'_{D3} = (V_{REF2} - V_{REF1}) \times K_4 + (V_{RER1} - 0) \times K_5 - \frac{V_{OS}}{K_1}. \quad (19)$$

As described in 420, the parameter is calculated:

$$K_5 = \frac{V'_{D3} - (V_{REF2} - V_{REF1}) \times K_4 + (V_{OS}/K_1)}{V_{RER1}}. \quad (20)$$

As a result, the processor 106 calculates the parameters $K_4$ and $K_5$ and stores the values of parameters $K_4$ and $K_5$ into a data memory in the processor 106. The flowchart 402 goes to block 422 to end the one-time calibration process.

In block 430, the battery monitoring system 200 starts the real-time calibration process. In blocks 432 and 434, the battery monitoring system 200 performs operations similar to those described for blocks 412 and 414. In block 432, the battery monitoring system 200 sets $V_{IN1} = V_{OUT1} = 0$, sets $V_{IN2} = V_{REF1}$, and measures a present level (or a real-time level) $V'_{D4}$ of $V_{OUT2} - V_{OUT1}$. In block 434, the battery monitoring system 200 sets $V_{IN1} = V_{OUT1} = 0$, sets $V_{IN2} = V_{REF2}$, and measures a present level (or a real-time level) $V'_{D5}$ of $V_{OUT2} - V_{OUT1}$.

Thus, based on equation (4), the following equations are obtained:

$$V'_{D4} = V_{REF1} \times K_4 - \frac{V_{OS}}{K_1}; \quad (21a)$$

$$V'_{D5} = V_{REF2} \times K_4 - \frac{V_{OS}}{K_1}. \quad (21b)$$

As described in block 436, the term $V_{OS}/K_1$ is calculated:

$$\frac{V_{OS}}{K_1} = \frac{V_{REF2} \times V'_{D4} - V_{REF1} \times V'_{D5}}{V_{REF1} - V_{REF2}}. \quad (22)$$

In block 438, the processor 106 sets n=1. In block 440, the battery monitoring system 200 sets $V_{IN2} = V_H(n)$, sets $V_{IN1} = V_L(n)$, and measures a present level (or a real-time level) $V'_D(n)$ of $V_{OUT2} - V_{OUT1}$. For example, when n=1, the processor 106 turns on the switches 214_1 and 216_1, such that $V_{IN2} = V_H(1)$ and $V_{IN} = V_L(1)$. Meanwhile, the processor 106 measures/obtains a present voltage level difference $V'_D(1)$ between the output terminals 120_1 and 120_2, e.g., $V'_D(1) = V_{OUT2} - V_{OUT1}$, via the ADC 104.

Thus, based on equation (4), the following equation is obtained:

$$V'_D(1)=[V_H(1)-V_L(1)]\times K_4+[K(1)-V_{OUT1}]\times K_5-(V_{OS}/K_1). \quad (23)$$

In equation (23), the voltage levels $V_L(1)$ and $V_{OUT1}$ are zero volts. As described in block 442, the voltage level $V_H(1)$ is calculated:

$$V_H(1) = \frac{V'_D(1)+(V_{OS}/K_1)}{K_4}. \quad (24)$$

The voltage across the cell 230_1 is equal to $V_H(1)-V_L(1)=V_H(1)$.

In block 444, the processor 106 compares the number n with the number (e.g., 4) of cells 230_1-230_4. If the number n is less than the number (e.g., 4) of cells 230_1-230_4, the flowchart 404 goes to block 346 to increase the value of the number n by one. The flowchart 404 goes to block 440 and then block 442. Similarly, the following equation is obtained:

$$V'_D(2)=[V_H(2)-V_L(2)]\times K_4\pm[V_L(2)-V_{OUT1}]\times K_5-(V_{OS}/K_1). \quad (25)$$

Thus, the voltage level $V_H(2)$ is calculated:

$$V_H(2) = \frac{V'_D(2)+(V_{OS}/K_1)-V_H(1)\times K_5}{K_4}+V_H(1). \quad (26)$$

The voltage across the cell 230_2 is equal to $V_H(2)-V_L(2)=V_H(2)-V_H(1)$. By repeating the operations in blocks 446, 440 and 442, all the cell voltages respectively across the cells 230_1-230_4 are calculated.

Turning to block 444, if the number n is equal to the number (e.g., 4) of cells 230_1-230_4, the flowchart 404 goes to block 448 to end the real-time calibration process. Advantageously, the processor 106 can calculate a real-time value of the term $V_{OS}/K_1$ right before each round of battery monitoring process. Thus, the processor 106 can calculate the cell voltages of the cells 230_1-230_4 more accurately.

Figure 5:
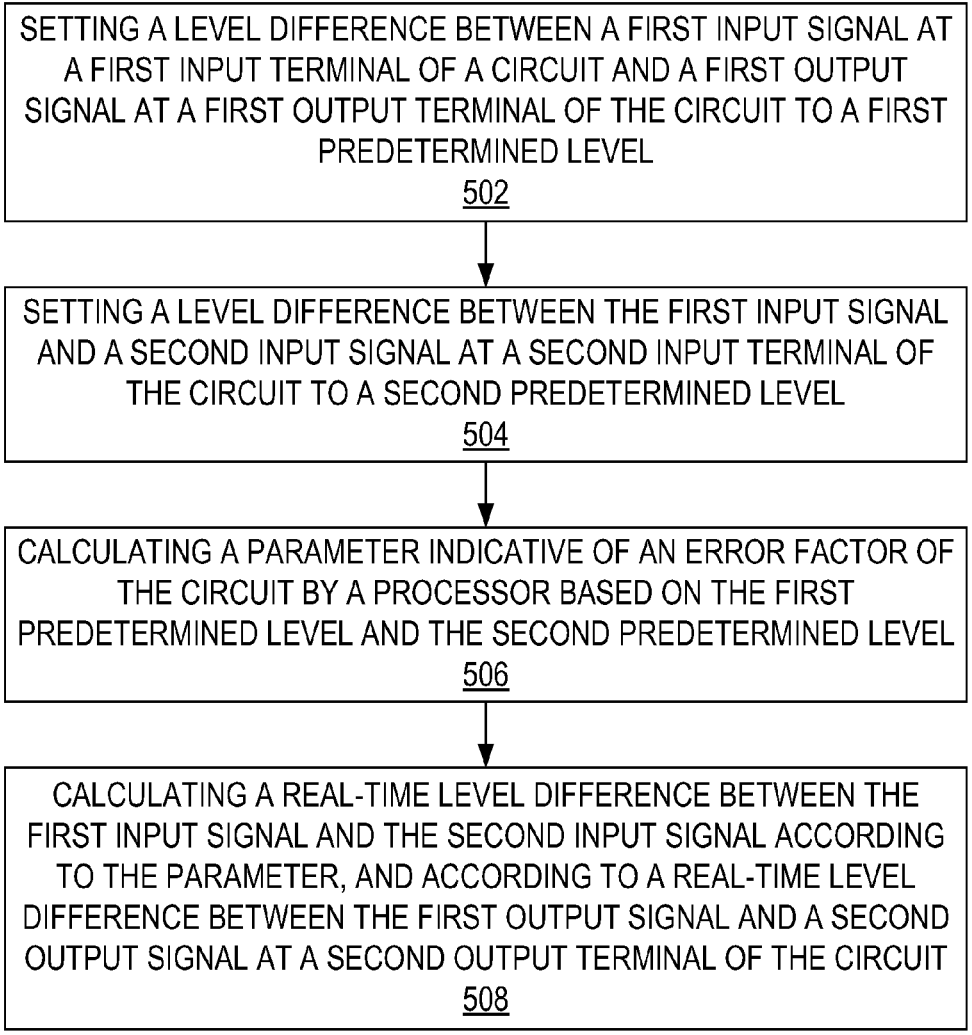
FIG. 5 illustrates a flowchart of examples of operations performed by a signal monitoring system, in accordance with one embodiment of the present invention.

FIG. 5 illustrates a flowchart 500 of examples of operations performed by the battery monitoring system 200, in accordance with one embodiment of the present invention. FIG. 5 is described in combination with FIG. 1A, FIG. 1B and FIG. 2.

In block 502, the battery monitoring system 200 sets a level difference between the first input signal $V_{IN1}$ at the first input terminal 110_1 of the signal shifting circuit 102 and the first output signal $V_{OUT1}$ at the first output terminal 120_1 of the signal shifting circuit 102 to a first predetermined level $V_{PRE1}$.

In block 504, the battery monitoring system 200 sets a level difference between the first input signal $V_{IN1}$ and the second input signal $V_{IN2}$ at the second input terminal 110_1 of the signal shifting circuit 102 to a second predetermined level $V_{PRE2}$.

In block 506, the processor 106 calculates a parameter, e.g., $V_{OS}$, $K_4$, $K_5$, etc., indicative of an error factor of the signal shifting circuit 102 based on the first predetermined level $V_{PRE1}$ and the second predetermined level $V_{PRE2}$.

In block 508, the processor 106 calculates a real-time level difference between the first input signal $V_{IN1}$ and the second input signal $V_{IN2}$ according to the parameter, and according to a real-time level difference between the first output signal $V_{OUT1}$ and the second output signal $V_{OUT2}$ at the second output terminal 120_2 of the signal shifting circuit 102. For example, the processor 106 calculates a voltage across each cell of the cells 230_1-230_4 according to the parameters $V_{OS}$, $K_4$, and $K_5$, and according to the real-time level $V_D(n)$ or $V'_D(n)$.

Accordingly, embodiments according to the present invention provide signal monitoring systems and battery monitoring systems. A signal shifting circuit may have one or more error factors. An error factor of the signal shifting circuit may vary as the ambient condition varies. Advantageously, a processor can control the signal shifting circuit to receive predetermined reference signals and measure corresponding output signals of the signal shifting circuit. Based on the equations discussed above, the processor calculates one or more parameters indicative of the error factors. A signal monitoring system can be implemented in the battery monitoring system to monitor cell voltages of a set of cells. Based on the calculated parameters, cell voltages are monitored more accurately.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A system comprising:
   a circuit comprising:
      a first input terminal;
      a first output terminal; and
      an amplifier coupled to said first input terminal via a first resistive component, and coupled to said first output terminal via a second resistive component;
   a multiplexer coupled to said circuit and operable for providing a selected signal that is selected from a reference signal and a plurality of real-time input signals to said circuit, and wherein each real-time input signal of said plurality of real-time input signals indicates a voltage level at a terminal of a corresponding battery cell of said battery cells; and
   a processor coupled to said circuit and operable for calibrating said system, said calibrating comprising setting a level difference between a first input signal at said first input terminal and a first output signal at said first output terminal to a first predetermined level.

2. The system as claimed in claim 1, wherein said circuit further comprises a second input terminal and a second output terminal, and wherein said amplifier is coupled to said second output terminal via a third resistive component and coupled to said second input terminal via a fourth resistive component.

3. The system as claimed in claim 1, wherein said system is calibrated based on a parameter indicative of an error factor of said circuit.

4. The system as claimed in claim 3, wherein said error factor comprises an input voltage offset of said amplifier.

5. The system as claimed in claim 3, wherein said circuit further comprises a second input terminal, and wherein said parameter is calculated by setting said level difference between said first input signal and said first output signal to said first predetermined level and setting a level difference between said first input signal and a second input signal at said second input terminal to a second predetermined level.

6. The system as claimed in claim 3, wherein said circuit further comprises a second input terminal and a second output terminal, and wherein a real-time level difference between said first input signal and a second input signal at said second input terminal is calculated according to said parameter and also according to a real-time level difference between said first output signal and a second output signal at said second output terminal.

7. The system as claimed in claim 3, wherein a value of said parameter varies as an ambient condition varies.

8. The system as claimed in claim 1, wherein said circuit further comprises a second input terminal and a second output terminal, and wherein a voltage level difference between said first output terminal and said second output terminal is given by $V_{OUT2}-V_{OUT1}=(V_{IN2}-V_{IN1})*K_4+(V_{IN1}-V_{OUT1})*K_5-V_{OS}/K_1$, where $V_{OUT1}$ represents a voltage level at said first output terminal, $V_{OUT2}$ represents a voltage level at said second output terminal, $V_{IN1}$ represents a voltage level at said first input terminal, $V_{IN2}$ represents a voltage level at said second input terminal, $V_{OS}$ represents a voltage offset of said circuit, $K_1$ represents a first resistance ratio of said circuit, $K_4$ represents a second resistance ratio of said circuit, and $K_5$ represents a third resistance ratio of said circuit.

9. The system as claimed in claim 1, further comprising:
an analog-to-digital converter coupled to said circuit and operable for providing a digital signal to said processor, wherein said digital signal indicates a level difference between said first output signal and a second output signal at a second output terminal of said circuit.

10. The system as claimed in claim 1, wherein said multiplexer is operable for providing said selected signal to a second input terminal of said circuit.

11. A method comprising:
setting a level difference between a first input signal at a first input terminal of a circuit and a first output signal at a first output terminal of said circuit to a first predetermined level, wherein said circuit comprises an amplifier coupled to said first input terminal via a first resistive component and coupled to said first output terminal via a second resistive component;
selecting a selected signal from a reference signal and a plurality of real-time input signals, wherein each real-time input signal of said plurality of real-time input signals indicates a voltage level at a terminal of a corresponding battery cell of a plurality of battery cells;
providing said selected signal to said circuit; and
calibrating a system based on said setting of said level difference.

12. The method as claimed in claim 11, further comprising:
setting a level difference between said first input signal and a second input signal at a second input terminal of said circuit to a second predetermined level;
calculating a parameter indicative of an error factor of said circuit based on said first and second predetermined levels; and
calibrating said system using said parameter.

13. The method as claimed in claim 12, wherein a value of said parameter varies as an ambient condition varies.

14. The method as claimed in claim 11, wherein said calibrating comprises calculating a real-time level difference between said first input signal and a second input signal at a second input terminal of said circuit according to a parameter indicative of an error factor of said circuit and according to a real-time level difference between said first output signal and a second output signal at a second output terminal of said circuit.

15. The method as claimed in claim 11, wherein said calibrating comprises calculating a voltage level difference between said first output terminal and a second output terminal of said circuit based on an equation: $V_{OUT2}-V_{OUT1}=(V_{IN2}-V_{IN1})*K_4+(V_{IN1}-V_{OUT1})*K_5-V_{OS}/K_1$, where $V_{OUT1}$ represents a voltage level at said first output terminal, $V_{OUT2}$ represents a voltage level at said second output terminal, $V_{IN1}$ represents a voltage level at said first input terminal, $V_{IN2}$ represents a voltage level at a second input terminal of said circuit, $V_{OS}$ represents a voltage offset of said circuit, $K_1$ represents a first resistance ratio of said circuit, $K_4$ represents a second resistance ratio of said circuit, and $K_5$ represents a third resistance ratio of said circuit.

16. The method as claimed in claim 11, further comprising:
providing said selected signal to a second input terminal of said circuit.

17. A system comprising:
a circuit comprising a first input terminal, a second input terminal, and a first output terminal, and operable for selectively receiving a first voltage level at a first detect terminal via said first input terminal and selectively receiving a second voltage level at a second detect terminal via said second input terminal, said circuit further comprising an amplifier coupled to said first input terminal via a first resistive component and coupled to said first output terminal via a second resistive component;
a multiplexer coupled to said circuit and operable for providing a selected signal that is selected from a reference signal and said second voltage level to said circuit, wherein said second voltage level comprises a plurality of real-time input signals, and each real-time input signal indicates a voltage level at a terminal of a corresponding battery cell of a plurality of battery cells; and
a processor coupled to said circuit and operable for calibrating said system by setting a voltage level difference between said first input terminal and said first output terminal to a first predetermined level, and operable for calculating a difference between said first and second voltage levels.

18. The system as claimed in claim 17, wherein said circuit further comprises a second output terminal of said circuit, and wherein said amplifier is coupled to said second output terminal via a third resistive component and coupled to said second input terminal via a fourth resistive component.

19. The system as claimed in claim 17, wherein said system is also calibrated by setting a voltage level difference between said first input terminal and said second input terminal to a second predetermined level.

20. The system as claimed in claim 17, wherein said system is calibrated based on a relationship between four voltage levels respectively at said first input terminal, said second input terminal, said first output terminal, and a second output terminal of said circuit.

21. The system as claimed in claim 20, wherein said system is calibrated by determining an error factor of said system according to said relationship, and wherein said error factor varies as an ambient condition varies.

22. The system as claimed in claim 17, wherein said circuit further comprises a second output terminal, and wherein a voltage level difference between said first output terminal and said second output terminal is given by $V_{OUT2}-V_{OUT1}=(V_{IN2}-V_{IN1})*K_4+(V_{IN1}-V_{OUT1})*K_5-V_{OS}/K_1$, where $V_{OUT1}$ represents a voltage level at said first output terminal, $V_{OUT2}$ represents a voltage level at said second output terminal, $V_{IN1}$ represents a voltage level at said first input terminal, $V_{IN2}$ represents a voltage level at said second input terminal, $V_{OS}$ represents a voltage offset of said circuit, $K_1$ represents a first resistance ratio of said circuit, $K_4$ represents a second resistance ratio of said circuit, and $K_5$ represents a third resistance ratio of said circuit.

23. The system as claimed in claim 17, further comprising:
an analog-to-digital converter coupled to said circuit and operable for providing a digital signal to said processor, wherein said digital signal indicates a voltage level difference between said first output terminal and said second output terminal.

24. The system as claimed in claim 17, wherein said multiplexer is operable for providing said selected signal to said second input terminal.

* * * * *